(12) United States Patent
Hayama et al.

(10) Patent No.: US 6,846,375 B2
(45) Date of Patent: Jan. 25, 2005

(54) METHOD OF MANUFACTURING MULTILAYER CERAMIC WIRING BOARD AND CONDUCTIVE PASTE FOR USE

(75) Inventors: Masaaki Hayama, Nara (JP); Kazuhiro Miura, Osaka (JP); Akira Hashimoto, Kyoto (JP); Takeo Yasuho, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/979,018
(22) PCT Filed: Mar. 15, 2001
(86) PCT No.: PCT/JP01/02044
§ 371 (c)(1), (2), (4) Date: Mar. 11, 2002
(87) PCT Pub. No.: WO01/69991
PCT Pub. Date: Sep. 20, 2001

(65) Prior Publication Data
US 2003/0019563 A1 Jan. 30, 2003

(30) Foreign Application Priority Data
Mar. 15, 2000 (JP) .......... 2000-071810
Mar. 16, 2000 (JP) .......... 2000-073812
Mar. 16, 2000 (JP) .......... 2000-073813

(51) Int. Cl.$^7$ ............... B32B 31/26; H05K 3/46
(52) U.S. Cl. ............... 156/89.16; 156/89.17; 156/89.18; 156/235
(58) Field of Search .......... 156/89.12, 89.16, 156/89.17, 89.18, 230, 235; 252/512, 514

(56) References Cited

U.S. PATENT DOCUMENTS 4,551,357 A * 11/1985 Takeuchi
4,808,770 A * 2/1989 Prabhu et al.
5,300,163 A * 4/1994 Ohtaki
5,336,301 A * 8/1994 Tani et al.
5,474,741 A * 12/1995 Mikeska et al. ......... 427/376.7
5,496,619 A * 3/1996 Itagaki et al.
5,498,580 A * 3/1996 Yamade et al. ........... 501/9

(List continued on next page.)

FOREIGN PATENT DOCUMENTS

| JP | 63-239999 | * 10/1988 |
| JP | 05-102666 | 4/1993 |
| JP | 5-174614 | 7/1993 |
| JP | 6-104572 | * 4/1994 |
| JP | 6-349314 | 12/1994 |
| JP | 8-17671 | 1/1996 |
| JP | 11-26289 | * 1/1999 |
| JP | 11-121645 | 4/1999 |
| JP | 11-135945 | * 5/1999 |
| JP | 11-233942 | 8/1999 |
| JP | 2000-188475 | * 7/2000 |

OTHER PUBLICATIONS

David W. Richerson, "Modern Ceramic Engineering," Marcel Dekker, Inc. 1992, p. 475.*

Primary Examiner—Melvin C. Mayes

(57) ABSTRACT

The present invention provides a method of manufacturing a low-temperature sintering multilayer ceramic wiring board comprising the steps of: forming a wiring layer by printing conductive paste (4) on an unfired green sheet (1); forming a laminate by laminating, on at least one side of a ceramic substrate, the unfired green sheet having the wiring layer; and firing the laminate. The present invention also provides paste for use with this method. In the firing step, after an adhesive layer (8) or binder resin in said green sheet used for lamination burns, glass ceramic in the green sheet starts to sinter, and upon or after the start of sintering of the glass ceramic, conductive particles in the conductive paste starts to sinter. This manufacturing method can provide an precise wiring board without pattern deformation and also provide a low-temperature ceramic multilayer wiring board that has no cracks in the glass ceramic on the periphery of electrodes and has electrodes of a dense film structure.

20 Claims, 2 Drawing Sheets

U.S. PATENT DOCUMENTS

| | | | |
|---|---|---|---|
| 5,609,704 A | * | 3/1997 | Hayama et al. |
| 5,618,470 A | * | 4/1997 | Yamana |
| 5,645,765 A | * | 7/1997 | Asada et al. |
| 5,807,508 A | * | 9/1998 | Kawahara et al. |
| 5,932,326 A | * | 8/1999 | Kashima et al. ............ 428/209 |
| 6,086,793 A | * | 7/2000 | Tani et al. ................... 252/512 |
| 6,174,462 B1 | * | 1/2001 | Oka et al. |
| 6,348,426 B1 | * | 2/2002 | Sanada et al. |
| 6,592,696 B1 | * | 7/2003 | Burdon et al. ........... 156/89.12 |

* cited by examiner

METHOD OF MANUFACTURING MULTILAYER CERAMIC WIRING BOARD AND CONDUCTIVE PASTE FOR USE

FIELD OF THE INVENTION

The present invention relates to a method for manufacturing a multilayer ceramic wiring board on which semiconductor LSIs and the like are mounted and wired to each other, and also relates to conductive paste for use with the wiring board.

BACKGROUND OF THE INVENTION

With recent advances in downsizing and weight reduction of semiconductor LSIs, chip components and the like, downsizing and weight reduction of wiring boards on which such elements are mounted are also desired. To meet such a request, multilayer ceramic wiring boards that allow high-density wiring thereon and can be formed thin have become increasingly valued in today's electronics industry.

Methods of manufacturing a multilayer ceramic wiring board are roughly classified into two kinds. One method is called multilayer printing method, in which insulating layers and conductive layers are printed alternately on a ceramic substrate. Another is called laminating method, in which a plurality of green sheets are laminated and fired.

The multilayer printing method has a problem of short circuits caused by involving foreign matters such as a little piece of thread during printing. To solve this problem, repeated printing of insulating paste to thicken insulating layers is performed. However, the operation becomes more complicated and chances of foreign matters involving increase when printing and drying are repeated. Therefore, this is not a complete solution.

Another solution is using a metal mask or low mesh screen mask to obtain a thick film at one printing operation. However, this method has problems such as occurrence of deviations in film thickness and difficulty of high-density wiring.

On the other hand, with the lamination method, shrinkage of the multilayer ceramic wiring board is involved by a sintering when the laminate is fired. The shrinkage involved by the sintering vary with board materials used, compositions of green sheets, lots of particles, and the like. The shrinkage poses several problems in production of a multilayer wiring board.

Firstly, because inner layer wiring in a green sheet laminate are fired before forming wiring on a uppermost layer, a high degree of plane-directional shrinkage of the board material hinders connection between patterns on the uppermost wiring and electrodes on the inner layer. As a result, a land of unnecessarily large area must be formed for electrodes on the uppermost layer so as to allow the shrinkage error. Therefore, such lamination method is difficult to be used for high-density wiring. To solve this problem, in some cases, a large number of screen masks for the wiring on the uppermost layer are prepared according to degrees of shrinkage and used according to shrinkage rates of the wiring board. This solution requires a large number of screen masks and is uneconomical.

If the wiring on the uppermost layer are fired with the inner layer at the same time, such a large land is unnecessary. However, with this simultaneous firing method, shrinkage of the wiring board still exists. As a result, in some cases, cream solder cannot be printed on required positions of the multilayer ceramic wiring board, in printing the cream solder for mounting components thereon. In addition, when components are mounted on the wiring board, the shrinkage causes displacement between the components and their predetermined positions.

In order to minimize such shrinkage error, it is necessary to sufficiently control not only substrate materials and green sheet compositions but also difference in particle lots and lamination conditions (press pressures and temperatures) during manufacturing process. However, it is said that deviation of approx. ±0.5% in shrinkage exists.

This problem resulting from shrinkage is not only of multilayer wiring boards but also is common to sintering of ceramics and glass ceramics.

Japanese Patent Laid-Open Publication No. H05-102666 discloses the following method. When a low-temperature sintering glass ceramic laminate is fired, a green sheet including inorganic fine particles that do not sinter at a sintering temperature of glass ceramic low-temperature sintering material is attached to at least one face of the low-temperature sintering glass ceramic laminate In the following description, "sintering" means not only simple sintering of crystals but also include a binding by a melting of glass components. In this method, after the laminate is fired, the inorganic fine particles are removed. As a result, the low-temperature sintering materials are sintered only in the thickness direction and a wiring board having no plane-directional shrinkage is produced. Consequently, the above problem resulting from the shrinkage of the wiring board involved by firing can be solved.

However, the above method for producing a wiring board requires a green sheet of inorganic fine particles other than glass ceramic green sheets. In addition, a process of removing non-sintering inorganic fine particles from the wiring board after firing is necessary.

DISCLOSURE OF THE INVENTION

The present invention is a method of manufacturing a low-temperature firing multilayer ceramic wiring board comprising the steps of:

forming a wiring layer by printing conductive paste on an unfired green sheet;

forming a laminate by laminating, on at least one face of a ceramic substrate, the unfired green sheet having the wiring layer formed thereon; and firing the laminate.

This method allows sintering of the board materials only in the thickness direction and production of a wiring board having no plane-directional shrinkage. Moreover, the sintered ceramic board itself can be used as a part of wiring board and such a step as removing inorganic fine particles can be eliminated.

The present invention is characterized by timing sintering of the green sheet to sintering of electrode (conductor) material in the following manner:

in the firing step, after binder resin in the green sheet burns out, glass ceramic in the green sheet starts to sinter, and upon or after the start of sintering of the glass ceramic, conductive particles in the conductive paste starts to sinter.

In other words, when sintering of the green sheet is not timed to sintering of electrode (conductor) material, the conductor material sinters earlier than the start of sintering of the board materials during firing, for example, and this causes cracks in the substrate on the periphery of electrodes after firing. For this reason, when the above multilayer wiring board having less plane-directional shrinkage is used, such conductive paste appropriate for the board is necessary.

The above manufacturing method in accordance with the present invention can provide an accurate wiring board without pattern deformation. The wiring board has no cracks in glass ceramic on the periphery of electrodes and has electrodes of a dense film structure.

The present invention is also characterized by further including a step of forming a second wiring layer on at least one face of a ceramic substrate prior to a lamination of the green sheet and the ceramic board. This step can prevent short circuits between wiring layers, which is one of the largest problem of a multilayer ceramic wiring board made by the conventional printing lamination method, and also provide a multilayer ceramic wiring board having high dimensional accuracy and no warp.

DESCRIPTION OF THE PREFERRED EMBODIMENTS

Figure 1:
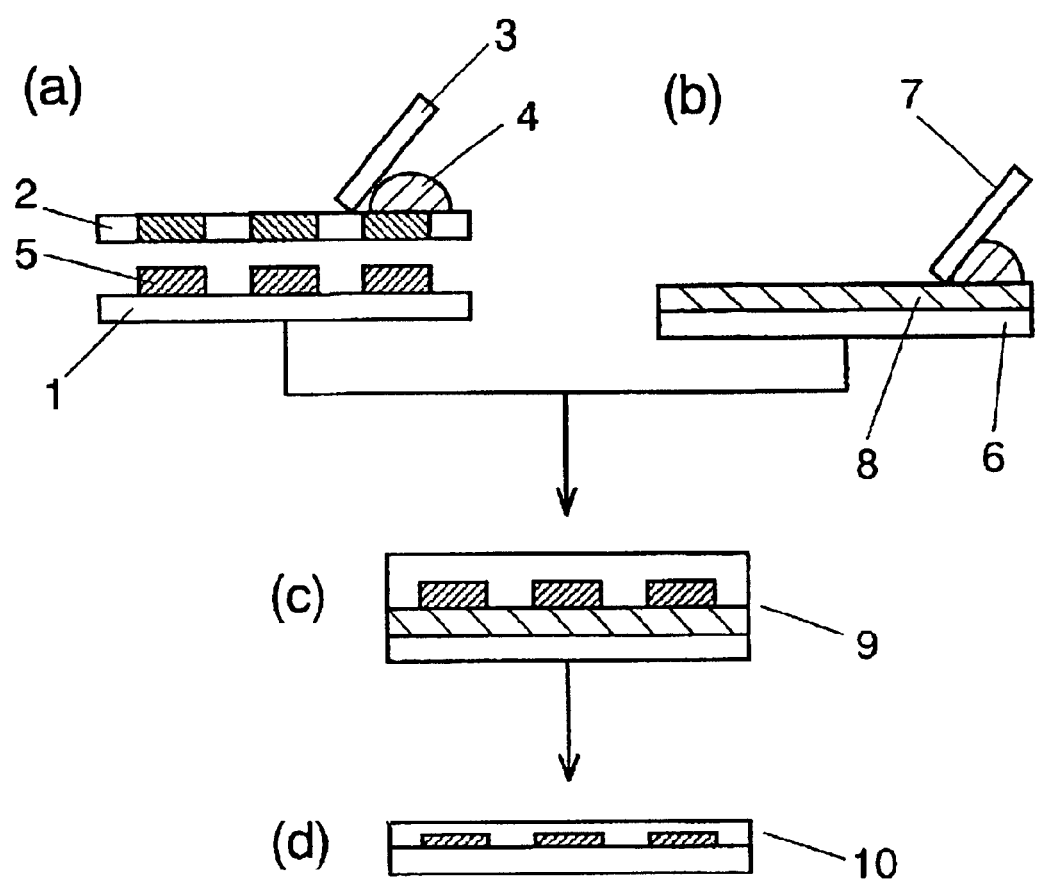
FIG. 1 is a schematic cross sectional view showing a manufacturing process of a multilayer ceramic wiring board in accordance with a first embodiment of the present invention.

A manufacturing process in accordance with the present invention includes the following steps.

Firstly, wiring patterns are printed on an unfired green sheet containing at least ceramic powder and glass as a main component, plasticizer and solvent, using conductive paste.

Next, the printed unfired green sheet is laminated on at least one face of a fired ceramic substrate. There are two lamination methods: one is using adhesive material and another is using a resin component contained in the green sheet. The number of green sheets to be laminated is at least one. Laminating a large number of green sheets as required can manufacture a laminate having a large number of lamination.

In the lamination, heat press bonding at a temperature of at least 70° C. can laminate the unfired green sheet onto the ceramic substrate uniformly. In addition, use of thermoplastic resin as a main component of the adhesive layer improves the adhesion property to the ceramic substrate and can provide an excellent multilayer wiring board without delamination of the laminated layers.

Thereafter, a multilayer ceramic wiring board having a large number of lamination can easily be manufactured by firing the laminate.

In the firing process, during or after burnout of the adhesive layer or resin, glass ceramic in the green sheet starts to sinter. Moreover, upon or after the start of sintering of the glass ceramic, the conductive particles in the conductive paste starts to sinter.

With the above method, the glass ceramic and conductive particles can sinter irrespective of softening, firing, and removing steps of the adhesive layer. As a result, an accurate wiring board without pattern deformation can be obtained.

In addition, the conductive particles in the conductive paste start to sinter upon or after the start of sintering of the glass ceramic. This step can provide a multilayer wiring board that has no cracks in glass ceramic on the periphery of electrodes and has electrodes of a dense film structure.

The conductive paste for use with the present invention is characterized by containing several kinds of glass frits each having different softening points. Use of the conductive paste of the present invention renders a function of adhering to the ceramic substrate and a function of having a sintering behavior timed to sintering of the green sheet, during firing of the conductive paste.

The green sheet for use with the present invention is characterized in that its glass ceramic particles start to sinter at a temperature ranging from 600° C. to 700° C. The composition of the green sheet allows the glass ceramic to start sintering after the organic binder in the adhesive layer or conductive paste is removed. Because factors that hinder the sintering are removed in this manner, excellent sintering condition is obtained at a low sintering temperature of 900° C.

Hereinafter described are specific embodiments of the present invention.

First Embodiment

A method of manufacturing a multilayer ceramic wiring board in accordance with a first embodiment of the present invention is hereinafter described with reference to the accompanying drawings.

FIG. 1($a$) is a schematic drawing showing a step of printing conductive paste on a green sheet using a screen mask in a process of manufacturing a multilayer ceramic wiring board in accordance with the first embodiment of the present invention. FIG. 1($b$) is a schematic drawing showing that an adhesive layer of thermoplastic resin is formed on a ceramic substrate. FIG. 1($c$) is a schematic drawing showing a step of laminating the green sheet on the ceramic substrate. FIG. 1($d$) shows a schematic drawing of a multilayer wiring board after firing.

A method of forming the multilayer board is described below.

Firstly, conductive paste 4 is printed on unfired glass ceramic green sheet 1 using screen mask 2 and squeegee 3 to form patterned conductor 5. The glass ceramic materials contained in the green sheet starts to sinter at a temperature of 600° C. In the conductive paste, silver/platinum alloy particle of 4.0 $\mu$m in diameter is used, as a conductor, and glass frits having softening temperatures of 625° C. and 785° C. are added thereto. The paste contains a plurality of resin components, which are burned and removed at temperatures ranging from 200° C. to 380° C.

Next, adhesive layer 8 of thermoplastic resin is formed on ceramic substrate 6 using ceramic squeegee 7. As the adhesive layer, a thermoplastic resin to be completely removed at a temperature of 450° C. is used.

Next, green sheet 1 having patterned conductor 5 formed thereon is laminated on ceramic substrate 6 having adhesive layer 8 formed thereon, and is heat press bonded to form laminate 9. The heat press bonding temperature is 130° C.

Next, the laminate is fired according to a firing profile (peak temperature: 900° C., ten minutes, and period of time from take-in to take-out: one hour) to obtain multilayer ceramic wiring board 10.

In accordance with this embodiment, after combustion of the adhesive layer or binder resin, the glass ceramic materials in the green sheet starts to sinter, and then the conductive particles in the conductive paste sinter. For this reason, the glass ceramic materials and conductive particles can sinter irrespective of softening and removal of the adhesive layer. As a result, an accurate wiring board without pattern deformation can be obtained. In addition, the conductive paste is designed so that sintering of the conductive particles is timed to the start of sintering of the glass ceramic. This paste can provide wiring board that has no cracks on the periphery of electrodes and has conductors of a dense film structure.

In this embodiment, the adhesive layer is formed using a ceramic squeegee; however, the present invention is not limited to the use of the ceramic squeegee. The adhesive layer can be formed by dipping, spraying, printing, or the like.

Second Embodiment

The conductive paste in accordance with the present invention is described below. The steps of pattern formation and firing are the same as those of first embodiment.

The glass ceramic materials contained in the green sheet used in this embodiment starts to sinter at a temperature of 650° C. In the conductive paste, gold particle of 3.2 µm in diameter is used, as a conductor, and glass frits having softening temperatures of 480° C. and 860° C. are mixed and added thereto. Table 1 shows a temperature range in which resins in the pastes are removed. In other words, in this embodiment, a plurality of pastes having different combinations of resins are used as shown in Table 1.

For each of the pastes, the cross section of the conductor is compared through observation of the cross section of the multilayer wiring board. According to the comparison, in each of pastes A and B, sintering of the conductor is proceeding; however, pattern deformation after firing is developed.

Each of pastes F and G results in poor sintering condition and was not appropriate for an electrode pattern of high-density wiring. Among these, each of pastes C, D, and E has no pattern deformation after firing and results in dense electrode condition. Especially, paste D, which has a temperature range of 200° C., has the best electrode surface condition.

The above results show that the conductive paste that contains a plurality of resin components burned and removed at temperatures ranging from 140° C. to 250° C. during firing process is the best. It is assumed that removal of a plurality of resin components in paste in an appropriate duration and within a wide temperature range can delay the start of sintering of the conductive particles and thus an accurate pattern without deformation can be formed irrespective of the binder resin or adhesive layer.

Third Embodiment

Another conductive paste in accordance with the present invention is described below. The steps of pattern formation and firing in this embodiment are the same as those of the first embodiment.

The glass ceramic material contained in the green sheet used starts to sinter at a temperature of 615° C. In the conductive paste, silver palladium particle of 2.0 µm in diameter is used, as a conductor. A glass frit having a softening point of 510° C. is added, as a low softening point glass frit, and a glass frit having various softening temperatures as shown in Table 2 is added, as a high softening point glass frit. In this embodiment, a plurality of pastes having different combinations of glass frits are prepared. A plurality of resin components contained in the pastes are removed within a temperature range of 220° C. to 360° C.

When the pastes shown in Table 2 were compared with each other, in each of pastes H and I, cracks resulting from shrinkage of electrodes are developed in the glass ceramic material on the periphery of the electrodes after firing. Paste N shows poor sintering condition and was not appropriate for a high-density electrode pattern. Among these, each of pastes J to M has no cracks in the glass ceramic material after firing and had dense electrode condition. Especially, paste K, which uses a glass frit having a softening temperature of 790° C., shows the best electrode condition.

The above results show that setting the softening point of the high softening glass contained in the conductive paste to a temperature ranging from 760° C. to 870° C. can control sintering condition of the conductor contained in the paste. With the above composition, a multilayer ceramic wiring board without cracks can be produced even when the paste and the glass ceramic green sheet are fired simultaneously.

Fourth Embodiment

Another conductive paste in accordance with the present invention is described below. The steps of pattern formation and firing are the same as those of the first embodiment.

The glass ceramic material contained in the green sheet used starts to sinter at a temperature of 680° C. In the conductive paste, silver particle of 1.5 µm in diameter is used. A glass frit having a softening point of 760° C. is added, as a high softening point glass flit, and a glass frit having various softening temperatures as shown in Table 3 is added, as a low softening point glass flit. A plurality of pastes having different combinations of glass frits are prepared. A plurality of resin components contained in the pastes are removed at temperatures ranging from 220° C. to 440° C.

When the pastes shown in Table 3 are compared with each other, in each of pastes O and P, cracks are developed in the glass ceramic material on the periphery of electrodes after firing. In each of pastes U and V, delamination is developed between the alumina substrate and the electrodes. Among these, each of pastes Q to T has no cracks in the glass ceramic material after firing and has excellent adhesion to the alumina substrate. Especially, paste S, which uses a glass frit having a softening temperature of 600° C., shows the best electrode condition.

The above results show that softening of the glass frit contained in the conductive paste at temperatures ranging from 450° C. to 650° C. is effective in rendering excellent adhesion between alumina substrate and the conductor. The results also show that an excellent multilayer ceramic wiring board can be produced because sintering of the conductive particles is not hastened more than required in the above composition, and thus no cracks occur in the glass ceramic material.

Fifth Embodiment

A fifth embodiment of the present invention is described below.

In the conductive paste of this embodiment, silver particle of 6.0 µm in diameter is used, and a glass frit having a particle diameter of 5.5 µm and a softening temperature of 625° C. is used. A plurality of conductive pastes to which different amounts of the glass frit are added are prepared and compared with each other as shown in Table 1. The composition of the paste is shown in Table 4.

The steps of pattern formation and firing in this embodiment are the same as those of the first embodiment.

The pastes are compared with each other through observation of the cross sections of the wiring boards. According to the comparison, in paste A, sintering of the conductor is proceeding; however, cracks were developed in the glass ceramic layer. Each of paste G and H had poor sintering condition and are not appropriate for an electrode pattern of high-density wiring. Among these, each of pastes B to F has no cracks in the glass ceramic layer after firing and had dense electrode condition. Especially, paste C, which has 3 wt. % of grass frit, shows the best electrode condition.

The above results show that the conductive paste having 92.0 wt. % to 98.5 wt. % of conductive component, 1.5 wt. % to 8.0 wt. % of glass component can provide wiring that has no cracks in the glass ceramic layer on the periphery of electrodes and has electrodes of a dense film structure.

Sixth Embodiment

The conductive paste of this embodiment is described below.

The steps of pattern formation and firing in this embodiment are the same as those of the fifth embodiment.

In the conductive paste of this embodiment, gold particle of 8.0 $\mu$m in diameter is used, and 4.0 wt. % of glass frits of 6.2 $\mu$m in particle diameter is added thereto. The softening temperatures of the glass frits used are shown in Table 5. As shown in Table 5, a plurality of pastes having different softening temperatures glass flits are prepared.

The pastes are compared with each other through observation of the cross sections of the multilayer wiring boards. According to the comparison, in paste I, sintering of the conductor is proceeding; however, cracks are developed in the glass ceramic layer. With each of pastes O and P, cracks are developed in the glass ceramic layer. Among these, each of pastes J to N has no cracks in the glass ceramic layer and has dense electrode condition. Especially, paste K, which has a glass frit having a softening temperature of 465° C., shows the best electrode condition.

The above results show that setting the softening temperatures of glass frits used in the conductive paste from 400° C. to 650° C. allows the glass to soften at low temperatures, to enter between the conductor and alumina substrate, resulting in a close contact between them. And, thus, friction between the conductor and the alumina substrate inhibits the sintering shrinkage of the conductor. Consequently, cracks resulting from shrinkage of electrodes can be prevented.

Seventh Embodiment

The conductive paste of this embodiment is described below.

The steps of pattern formation and firing in this embodiment are the same as those of Fifth Embodiment.

In the conductive paste of this embodiment, silver/palladium particle of 8.5 $\mu$m in diameter is used, and 7.0 wt. % of a glass frit having a softening temperature of 575° C. are added thereto. The particle diameters of the glass frits used are shown in Table 6. As shown in the table, a plurality of pastes having different particle diameters are prepared.

When the pastes are compared with each other, in each of pastes Q and R, cracks resulting from shrinkage of electrodes are developed in the glass ceramic layer on the periphery of the electrodes after firing. Also in each of pastes W and X, cracks are developed in the glass ceramic layer. Among these, each of pastes S to V shows no cracks in the glass ceramic layer after firing and has dense electrode condition. Especially, paste U, which has a glass frit of 7 $\mu$m in particle diameter, shows the best electrode condition.

The above results show that setting the particle diameter of the glass frit from 5.0 to 8.0 $\mu$m allows firing without promoting sintering shrinkage of conductive particles even when a glass having a low softening temperature is used, and thus prevents cracks resulting from shrinkage of the electrodes.

Eighth Embodiment

The conductive paste of this embodiment is described below.

The steps of pattern formation and firing in this embodiment are the same as those of fifth embodiment.

In the conductive paste of this embodiment, silver/platinum alloy is used, and 4.0 wt. % of glass frit having a softening temperature of 400° C. and a particle diameter of 8.0 $\mu$m is added. The particle diameters of the conductive particles added to the pastes are shown in Table 7. As shown in the table, a plurality of pastes having different particle diameters are prepared.

When the pastes were compared with each other, in each of pastes Y and Z, cracks are developed in the glass ceramic layer on the periphery of the electrodes after firing. Each of pastes AF and AG has poor sintering condition and is not appropriate for an electrode pattern of high-density wiring. Among these, each of pastes AA to AE has no cracks in the glass ceramic layer after firing and has dense and excellent electrode condition. Especially, paste AC, which has a particle diameter of 8.0 $\mu$m, has the best electrode condition.

The above results show that setting the particle diameter of the conductive particles from 6.0 $\mu$m to 10.0 $\mu$m can inhibit sintering shrinkage of conductive particles in firing of the conductive paste, and thus prevent cracks in the glass ceramic layer resulting from shrinkage of the electrodes.

In the above description, specific numeric values are provided; however, when the conductive paste has the following composition, excellent results can be obtained.

(1) Conductive component: 92.0 wt. % to 98.5 wt. % and Glass component: 1.5 wt. % to 8.0 wt. %
(2) Softening temperature of at least one glass frit: 400 (450) ° C. to 650° C.,
Softening temperature of at least one other glass frit: 760° C. to 870° C. and
Particle diameter of the glass frit: 5.0 $\mu$m to 8.0 $\mu$m
(3) Diameter of conductive particles in the conductive paste: 1.0 $\mu$m to 10.0 $\mu$m
(4) A plurality of resin components contained in the conductive paste are burned out within a temperature range of 140° C. to 250° C. and a plurality of resin components contained in the conductive paste are burned out at temperatures ranging from 200° C. to 450° C.

Setting the diameter of the conductive particles from 1.0 $\mu$m to 10.0 $\mu$m as described above can prevent sintering of the conductive particles from being hastened more than required and thus adjust a timing of sintering of the conductive particles to sintering of the glass ceramic materials in the green sheet.

While silver, silver palladium, silver/platinum, or gold is used as a conductive component in this embodiment, the same result can be obtained with a paste containing at least one selected from copper, silver, silver palladium, silver platinum and gold.

Moreover, when an adhesive layer and resin layer that can be removed at a temperature up to 450° C. is used, an accurate electrode pattern can be produced as well.

In other words, by using an adhesive layer and resin layer that can be removed at a temperature up to 450° C., the resin components are eliminated when the green sheet and the conductive paste are sintered, and thus they can be bonded to the ceramic substrate well.

The green sheet is laminated onto the ceramic substrate at a temperature of 130° C. in the first embodiment. However, heat press bonding at a temperature of at least 70° C. is applicable as well. At a temperature below 70° C., dense lamination cannot be made and delamination occurs during firing.

While sintering of the glass ceramic particles in the green sheet at temperatures of 600, 615, 650 and 680° C. is described in this embodiment, an accurate multilayer ceramic wiring board can be manufactured as well when the sintering starts at any temperature ranging from 600° C. to 700° C.

Ninth Embodiment

Figure 2:
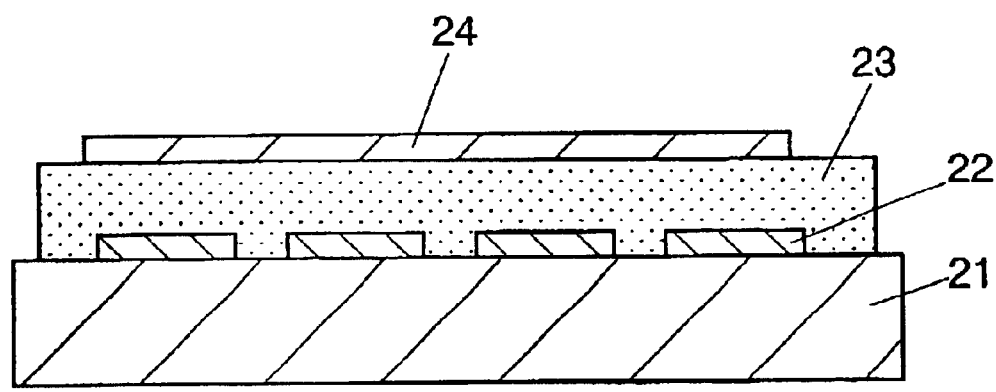
FIG. 2 is a cross sectional view of a multilayer ceramic wiring board in accordance with a ninth embodiment of the present invention.

A method of manufacturing a multilayer ceramic wiring board in accordance with this embodiment is hereinafter described with reference to the accompanying drawings. FIG. 2 is a cross sectional view of a multilayer ceramic wiring board in accordance with this embodiment.

First, wiring layers 22 are screen-printed on green sheet 23 using silver paste and dried beforehand. Successively, unfired green sheet 23 are overlaid on alumina substrate 21 and then heat press bonded at temperatures ranging from 50° C. to 150° C. and at a pressure ranging from 5 kg/cm$^2$ to 50 kg/cm$^2$ to bond ceramic substrate 21 and green sheet 23.

Green sheet 23 is obtained by kneading a low-temperature firing glass ceramic component comprising boro-silicated glass powder and alumina powder with an organic binder to form slurry and applying the slurry using doctor blade method and the like. In this embodiment, a green sheet having a film thickness of 10 $\mu$m after firing is used. In bonding to the substrate, applying a thermoplastic or thermosetting resin over the surface of alumina substrate 21 and then performing heat press bonding of green sheet 23 can provide more completely bonded condition.

Next, wiring layers 24 are formed on the bonded unfired green sheet 23 using silver paste and then fired at temperatures ranging from 850° C. to 1000° C. to obtain a multilayer ceramic wiring board.

The insulation resistance between the each of the wiring layers obtained in this embodiment are measured. No short circuits are observed and a very high insulation resistance of at least $10^{13}\Omega$ is obtained between the wiring layers. When the thickness between wiring layers is 10 $\mu$m, incidence of short circuits is so high as 80% with the conventional thick film printing method. In contrast, with the method in accordance with the present invention, no short circuit is observed and a highly reliable multilayer ceramic wiring board can be obtained.

While only one layer of green sheet is press bonded to the substrate in this embodiment, the same result can be obtained when a desired number of green sheets having wiring layers using silver paste are laminated.

Tenth Embodiment

Figure 3:
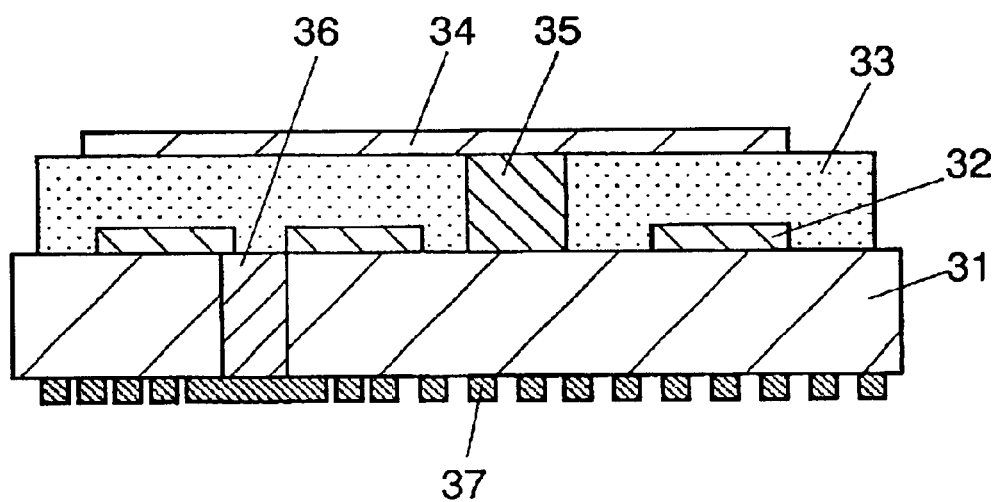
FIG. 3 is a cross sectional view of a multilayer ceramic wiring board in accordance with a tenth embodiment of the present invention.

A method for manufacturing a multilayer ceramic wiring board in accordance with this embodiment is hereinafter described with reference to the accompanying drawings. FIG. 3 is a cross sectional view of a multilayer ceramic wiring board in accordance with this embodiment.

Through holes are formed in positions of sintered alumina substrate 31 where electrical connections between front and back faces are desired, using $CO_2$ laser. After the formation of the through holes, the through holes were filled with silver/palladium paste and fired to form through holes 36.

Next, through holes are made in required positions of green sheet 33 using a puncher to form via holes. Then, the via holes are filled with silver/palladium paste and dried to form via 35. Thereafter, wiring layer 32 is screen-printed on green sheet 33 having via 35 and dried.

Successively, green sheet 33 is overlaid on alumina substrate 31 and then heat press bonded at temperatures ranging from 50° C. to 150° C. and pressures ranging from 5 kg/cm$^2$ to 50 kg/cm$^2$ to bond fired ceramic substrate 31 and green sheet 33.

Green sheet 33 is produced in a manner similar to that of the ninth embodiment. Also, the effect of the thermoplastic or thermosetting resin in bonding is the same as that of the ninth embodiment.

Next, wiring layer 34 is formed on green sheet 33 after the bonding, using silver paste, and thereafter they are fired at temperatures ranging from 850° C. to 1000° C. to obtain a multilayer ceramic wiring board.

Successively, backside wiring layer 37 is screen-printed on substrate 31 on a opposite face of the green sheet lamination, using conductive paste, in a manner so that the back face wiring is connected to through hole 32, and fired be obtain a multilayer wiring board having wiring layers on both faces.

The insulating resistance between each of the wiring layers of the wiring board obtained in this embodiment is also so high as at least $10^{13}\Omega$ and a highly reliable wiring board having wiring layers on both faces can be obtained.

While only one layer of green sheet is press bonded in this embodiment, a multilayer ceramic wiring board can be obtained when a desired number of green sheets each having via and a wiring layer made using silver paste are laminated to provide multiple layers. In addition, in this embodiment, a screen printing method is used for the formation of back face wiring layer 37. However, the same result can be obtained and a more precise pattern can be formed using the intaglio transfer printing method.

While back face wiring are printed after firing of the green sheet in this embodiment, they can be printed prior to firing of the green sheet, followed by a simultaneous firing of wiring on both faces.

In addition, it is also possible to print wiring pattern on at least one face of the substrate prior to green sheet lamination, followed by a simultaneous firing of the green sheet and the wiring pattern.

The features of this embodiment are as follows:

(1) Because a sintered ceramic substrate is used as a base material instead of a green sheet in the green sheet lamination method, a multilayer wiring board without warp and with high dimensional accuracy can be obtained.

(2) A multilayer ceramic wiring board having a desired number of lamination, no deviations in film thickness and no pores can be obtained (3) Electrical conduction between neighboring wiring layers laminated can be obtained at any desired positions. Therefore, a high degree of freedom in pattern designing can be obtained and a downsized high-performance multilayer wiring board can be manufactured.

(4) Green sheets can be laminated onto a fired ceramic substrate uniformly.

(5) Because sintering of the green sheet is completed at a relatively low temperature, influence on other components such as electrodes that have already been provided on the board can be reduced. Further, the structure makes it possible to use materials having properties different from those of electrodes on the inner layer, for electrodes on the outermost layer. This can add migration resistant property or the like properties, which improve the degree of freedom in design.

(6) Through holes allow electrical connection between front and back faces of the ceramic substrate at any desired position. This renders a higher degree of freedom in designing patterns and in manufacturing of a downsized high-performance multilayer wiring board. Moreover, a multilayer ceramic wiring board having excellent electrical characteristics and electrical conduction with a low resistance can be manufactured.

INDUSTRIAL APPLICABILITY

As described above, in accordance with the present invention, an precise wiring board without pattern deformation can be produced. This is because after combustion of resin components, glass ceramic starts to sinter and successively conductive particles in conductive paste sinter, in firing of a low-temperature multilayer ceramic wiring board. In addition, upon or after the start of sintering of the glass ceramic, the conductive particles in the conductive paste start to sinter. Thus, a low-temperature multilayer ceramic wiring board that has no cracks in the glass ceramic layer on the periphery of electrodes and has electrodes of a dense film structure can be manufactured.

TABLE 1

| Paste No. | A | B | C | D | E | F | G |
|---|---|---|---|---|---|---|---|
| Firing temperature range | 70 | 110 | 140 | 200 | 250 | 270 | 300 |

TABLE 2

| Paste No. | H | I | J | K | L | M | N |
|---|---|---|---|---|---|---|---|
| Softening temperature | 700 | 740 | 760 | 790 | 830 | 870 | 900 |

TABLE 3

| Paste No. | O | P | Q | R | S | T | U | V |
|---|---|---|---|---|---|---|---|---|
| Softening temperature | 400 | 430 | 450 | 500 | 600 | 650 | 680 | 700 |

TABLE 4

| Paste No. | A | B | C | D | E | F | G | H |
|---|---|---|---|---|---|---|---|---|
| Glass composition | 0.5 | 1.5 | 3.0 | 5.0 | 7.0 | 8.0 | 8.5 | 9.0 |
| Conductor composition | 99.5 | 98.5 | 97.0 | 95.0 | 93.0 | 92.0 | 91.5 | 91.0 |

Unit of Composition: Wt. %

TABLE 5

| Paste No. | I | J | K | L | M | N | O | P |
|---|---|---|---|---|---|---|---|---|
| Softening temperature | 380 | 400 | 465 | 510 | 595 | 650 | 675 | 710 |

TABLE 6

| Paste No. | Q | R | S | T | U | V | W | X |
|---|---|---|---|---|---|---|---|---|
| Glass particle diameter | 3 | 4 | 5 | 6 | 7 | 9 | 9 | 10 |

Unit of Glass Particle Diameter: $\mu$m

TABLE 7

| Paste No. | Y | Z | AA | AB | AC | AD | AE | AF | AG |
|---|---|---|---|---|---|---|---|---|---|
| Conductive particle diameter | 4 | 5 | 6 | 7 | 8 | 9 | 10 | 11 | 12 |

Unit of Conductive Particle Diameter: $\mu$m

What is claimed is:

1. A method of manufacturing a multilayer ceramic wiring board comprising the steps of:

forming a wiring layer by printing conductive paste on an unfired green sheet;

forming an adhesive layer on at least one face of a ceramic substrate, said adhesive layer comprising one of a thermoplastic resin and a thermosetting resin as a main component;

forming a laminate by laminating said unfired green sheet having said wiring layer on said face of the ceramic substrate;

firing said laminate so as to remove a binder resin in said green sheet and said adhesive layer; and sintering glass ceramic materials in said green sheet and conductive particles in said conductive paste onto said face of the ceramic substrate, wherein, after a burnout of said binder resin, said glass ceramic materials start to sinter, and one of upon and after start of sintering of said glass ceramic materials, said conductive particles start to sinter, wherein said conductive paste includes a plurality of resin components, each of the resin components has a burn-out temperature range having a variation of 140° C. to 250° C., and said plurality of resin components are burned out at a temperature of 200° C. to 450° C.

2. The method for manufacturing a multilayer ceramic wiring board according to claim 1 wherein, heat press bonding is performed at a temperature of at least 70° C. in said lamination step.

3. The method of manufacturing a multilayer ceramic wiring board according to claim 1 wherein said conductive paste includes 92.0 wt. % to 98.5 wt. % of conductive component and 1.5 wt. % to 8.0 wt. % of inorganic binder component.

4. The method of manufacturing a multilayer ceramic wiring board according to claim 1 wherein said conductive paste includes a plurality of kinds of glass frits, each having different softening points.

5. The method of manufacturing a multilayer ceramic wiring board according to claim 1 wherein at least one kind of glass frit in said conductive paste has a softening temperature ranging from 760° C. to 870° C.

6. The method of manufacturing a multilayer ceramic wiring board according to claim 1 wherein at least one glass frit in said conductive paste has a softening temperature ranging from 450° C. to 650° C.

7. The method of manufacturing a multilayer ceramic wiring board according to claim 1 wherein a particle diameter of a glass frit used in said conductive paste ranges from 5.0 $\mu$m to 8.0 $\mu$m.

8. The method of manufacturing a multilayer ceramic wiring board according to claim 1 wherein said adhesive layer is removed at a temperature up to 450° C.

9. The method of manufacturing a multilayer ceramic wiring board according to claim 1 wherein said conductive paste includes conductive particles having a diameter ranging from 1.0 $\mu$m to 4.0 $\mu$m.

10. The method of manufacturing a multilayer ceramic wiring board according to claim 1 wherein said conductive paste includes conductive particles having a diameter ranging from 6.0 $\mu$m to 10.0 $\mu$m.

11. The method of manufacturing a multilayer ceramic wiring board according to claim 1 wherein said conductive paste includes, as a conductive component, at least one selected from a group consisting of copper, silver, silver palladium, silver platinum, and gold.

12. The method of manufacturing a multilayer ceramic wiring board according to claim 1 wherein glass ceramic particles in said green sheet start to sinter at a temperature ranging from 600° C. to 700° C.

13. The method of manufacturing a multilayer ceramic wiring board according to claim 1 further comprising a step of forming a second wiring layer on at least one face of said ceramic substrate prior to said lamination.

14. The method of manufacturing a multilayer ceramic wiring board according to claim 13 wherein a plurality of unfired green sheets each having said wiring layer thereon are laminated to provide multiple layers.

15. The method of manufacturing a multilayer ceramic wiring board according to claim 14 wherein said unfired green sheet has at least one via hole for electrical connection between wiring formed on said plurality of unfired green sheets.

16. The method of manufacturing a multilayer ceramic wiring board according to claim 13 wherein said ceramic substrate has at least one through hole.

17. The method of manufacturing a multilayer ceramic wiring board according to claim 16 wherein an inside of said through hole is filled with a conductor.

18. The method of manufacturing a multilayer ceramic wiring board according to claim 1 wherein said wiring layer is formed using an intaglio transfer printing method.

19. The method of manufacturing a multilayer ceramic wiring board according to claim 1 wherein the step of firing said laminate so as to remove said adhesive layer causes at least a portion of respective surfaces of said ceramic substrate and said green sheet to come into contact with each other.

20. The method of manufacturing a multilayer ceramic wiring board of claim 1, wherein binder resin in said conductive paste is burned and removed at temperatures ranging from 200° C. to 380° C.

* * * * *